(12) United States Patent
Imafuji

(10) Patent No.: US 11,605,585 B2
(45) Date of Patent: Mar. 14, 2023

(54) FLEXIBLE SUBSTRATE AND SEMICONDUCTOR APPARATUS

(71) Applicant: SHINKO ELECTRIC INDUSTRIES CO., LTD., Nagano (JP)

(72) Inventor: Kei Imafuji, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/450,579

(22) Filed: Oct. 12, 2021

(65) Prior Publication Data

US 2022/0130739 A1    Apr. 28, 2022

(30) Foreign Application Priority Data

Oct. 28, 2020   (JP) .............................. JP2020-180721

(51) Int. Cl.
| | |
|---|---|
| H05K 1/02 | (2006.01) |
| H01L 23/498 | (2006.01) |
| H05K 1/14 | (2006.01) |
| H05K 1/18 | (2006.01) |
| H05K 1/11 | (2006.01) |

(52) U.S. Cl.
CPC .... *H01L 23/4985* (2013.01); *H01L 23/49822* (2013.01); *H05K 1/028* (2013.01); *H05K 1/118* (2013.01); *H05K 1/147* (2013.01); *H05K 1/189* (2013.01); *H05K 2201/05* (2013.01)

(58) Field of Classification Search
CPC ........... H01L 23/4985; H01L 23/49822; H01L 2224/16225; H01L 2224/32225; H01L 2224/73204; H01L 23/49894; H01L 23/5383; H01L 23/5387; H05K 1/118; H05K 1/147; H05K 1/148; H05K 1/189; H05K 2201/042; H05K 2201/05; H05K 2201/058; H05K 1/028; H05K 3/28; H05K 3/3452; H05K 2201/0989; H05K 2201/09909; Y10T 29/49117
See application file for complete search history.

(56) References Cited

U.S. PATENT DOCUMENTS

| | | | |
|---|---|---|---|
| 6,444,921 B1 * | 9/2002 | Wang .................. | H01L 23/4985 439/91 |
| 9,167,685 B2 | 10/2015 | Ikemoto et al. | |
| 2008/0179079 A1 * | 7/2008 | Ishii ...................... | H05K 1/028 174/254 |

(Continued)

FOREIGN PATENT DOCUMENTS

WO    2014/103772    7/2014

*Primary Examiner* — Steven T Sawyer
(74) *Attorney, Agent, or Firm* — IPUSA, PLLC

(57) ABSTRACT

A flexible substrate includes a first area including a first circuit, the first circuit configured to be connectable to a first component, a second area including a second circuit, the second circuit configured to be connectable to a second component, a connecting area provided between the first area and the second area and including a third circuit, the third circuit connecting the first circuit and the second circuit, one or more first via conductors provided between the first area and the connecting area and electrically isolated from the first circuit, the second circuit, and the third circuit, and one or more second via conductors provided between the second area and the connecting area and electrically isolated from the first circuit, the second circuit, and the third circuit.

9 Claims, 14 Drawing Sheets

(56) References Cited

U.S. PATENT DOCUMENTS

| | | | |
|---|---|---|---|
| 2009/0090541 A1* | 4/2009 | Chia | H01L 23/5387 |
| | | | 174/254 |
| 2013/0287335 A1* | 10/2013 | Nakashiba | G02B 6/4281 |
| | | | 385/14 |
| 2015/0373830 A1* | 12/2015 | Miyagawa | H05K 1/0281 |
| | | | 174/254 |
| 2017/0231082 A1* | 8/2017 | Yoshida | H05K 1/118 |
| 2020/0267831 A1* | 8/2020 | Koyama | H05K 1/0225 |

* cited by examiner

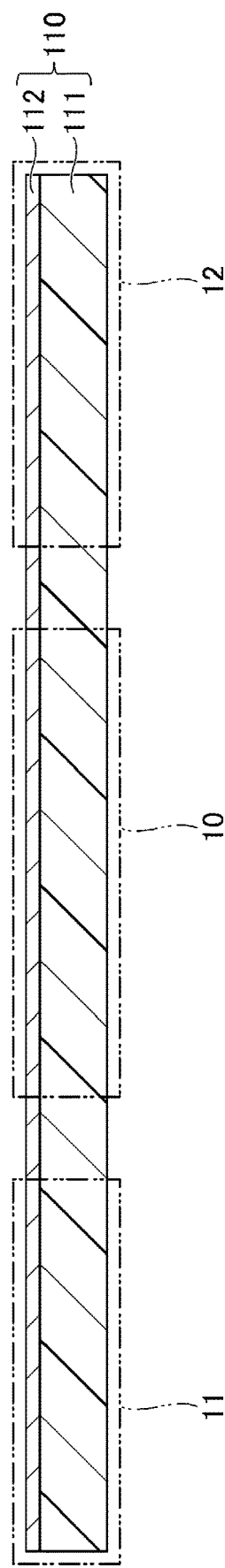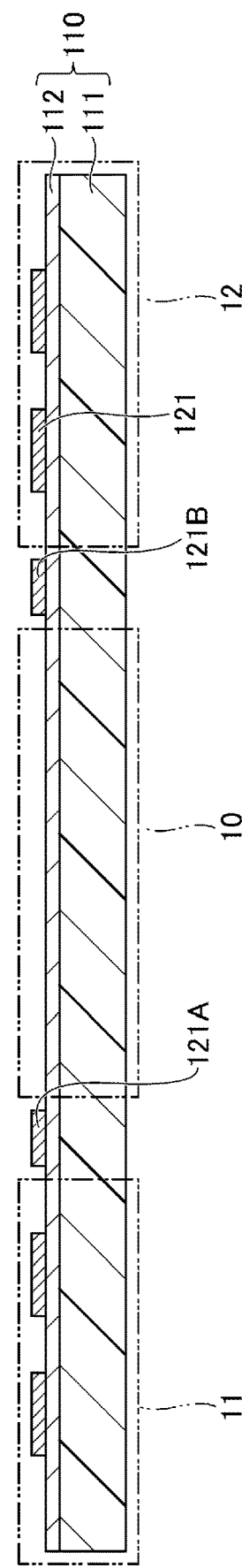

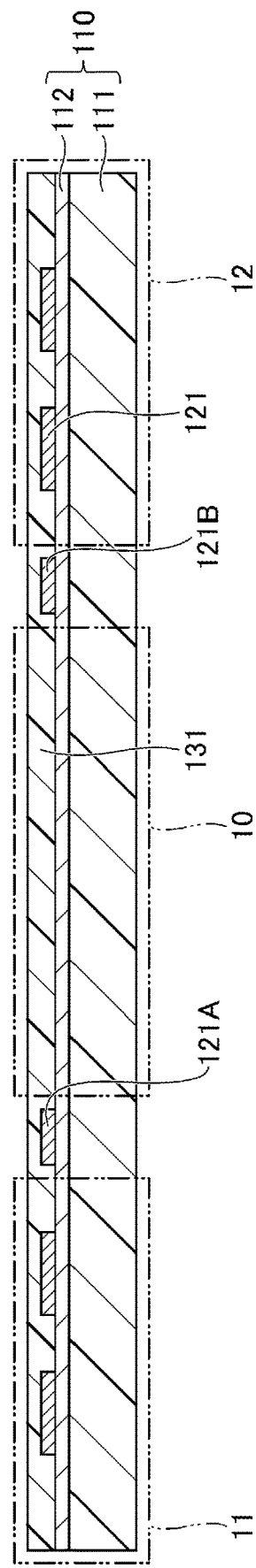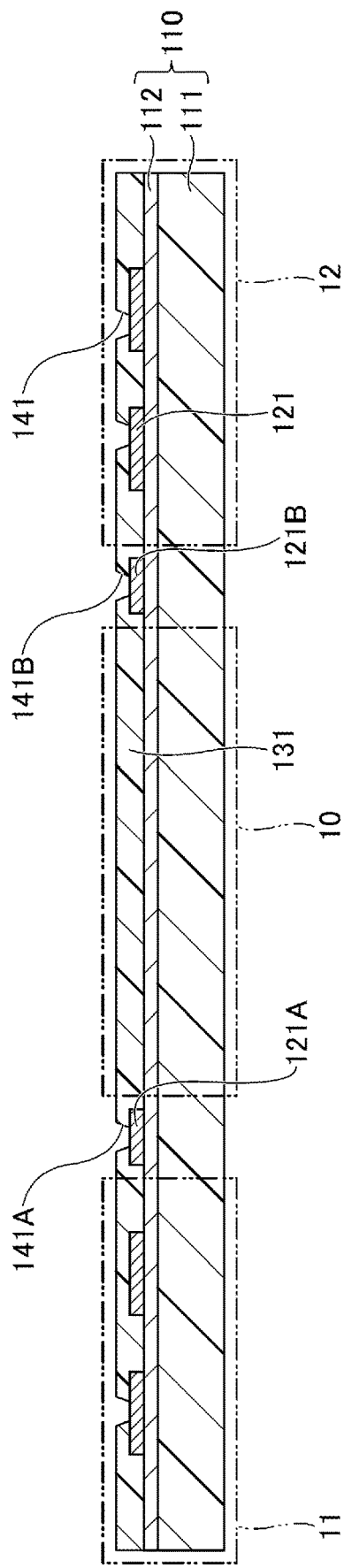

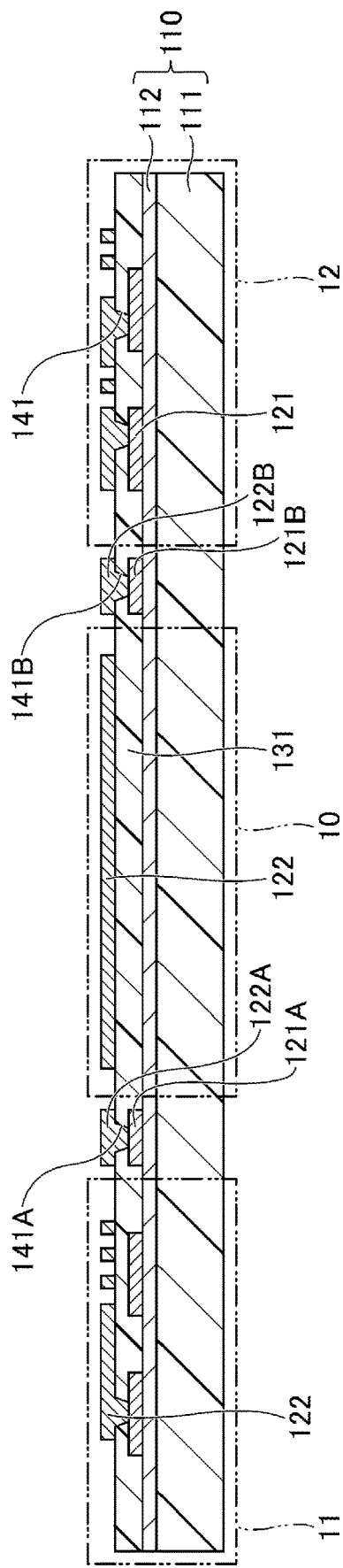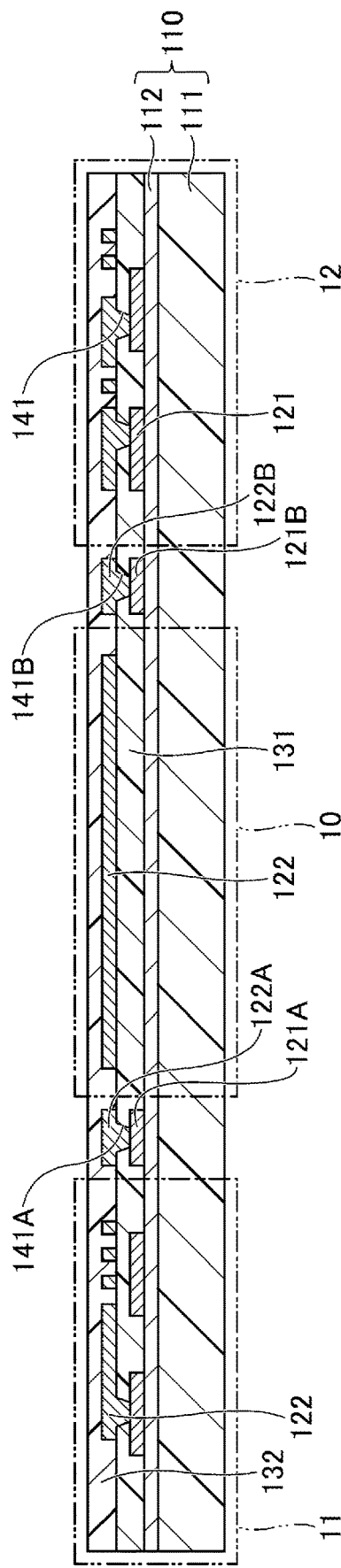

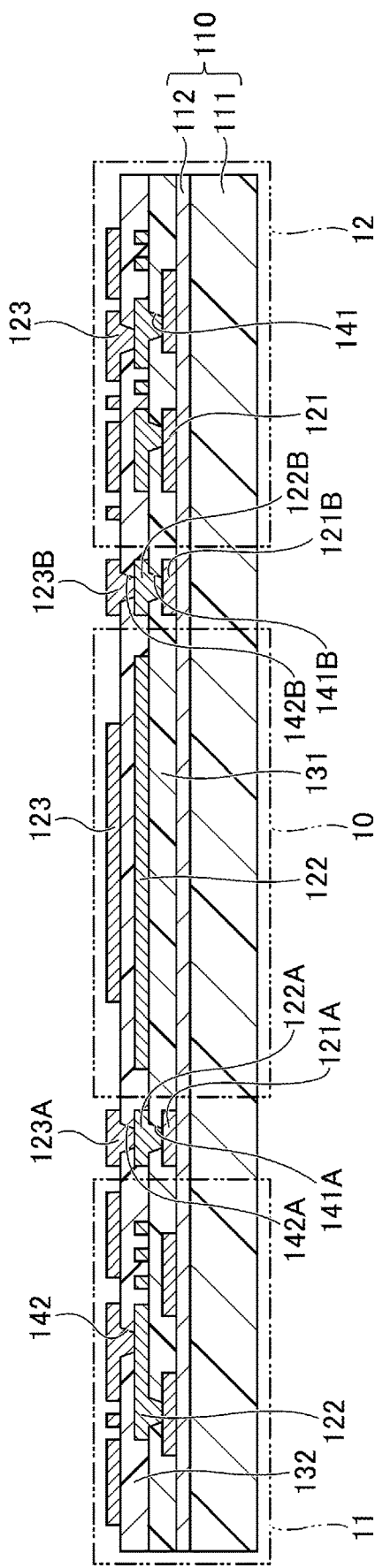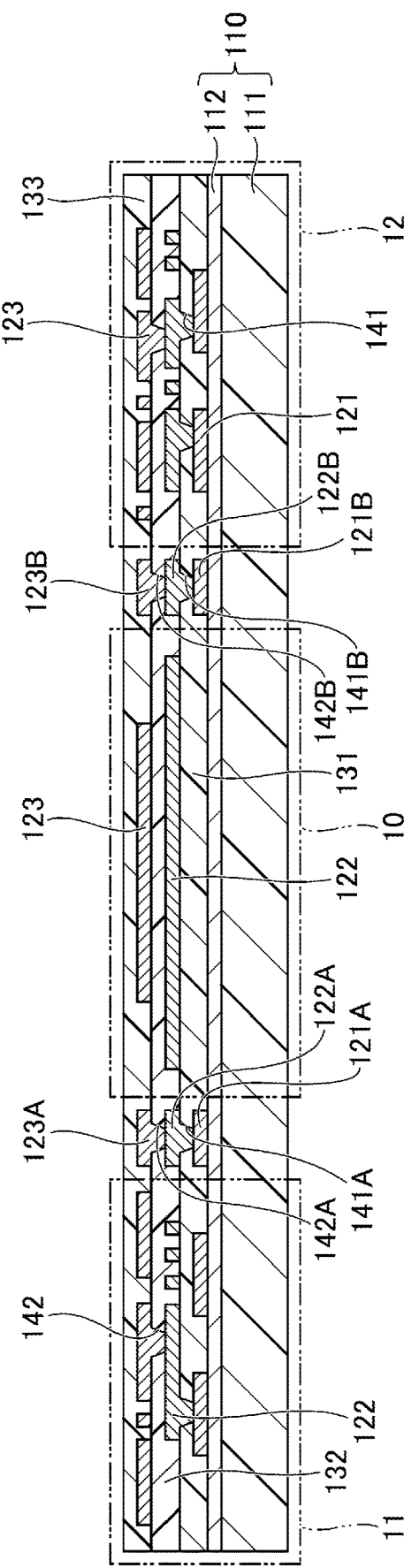

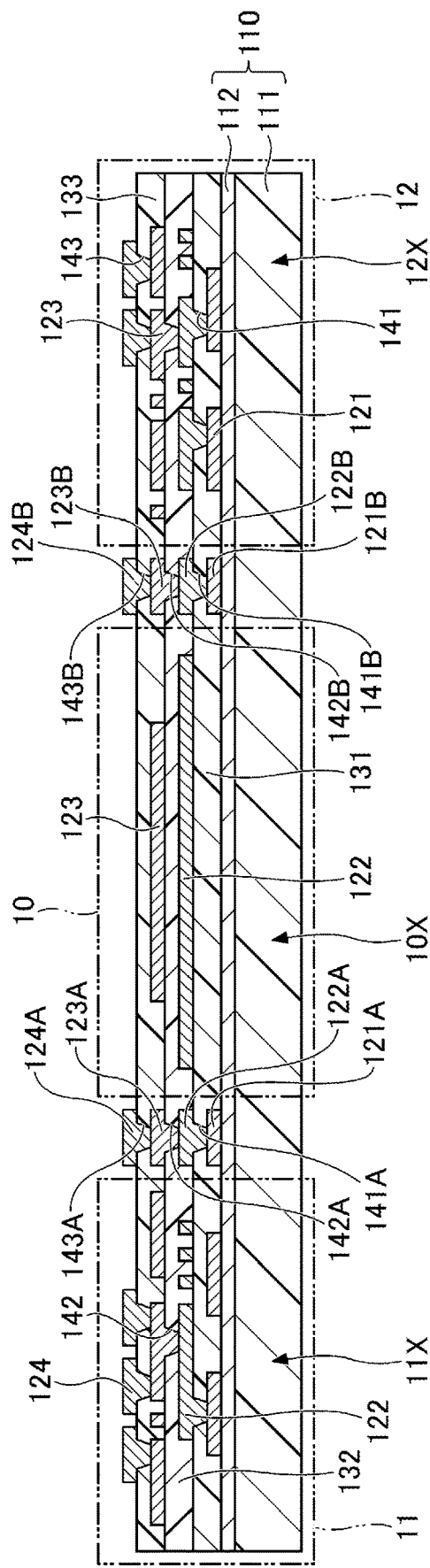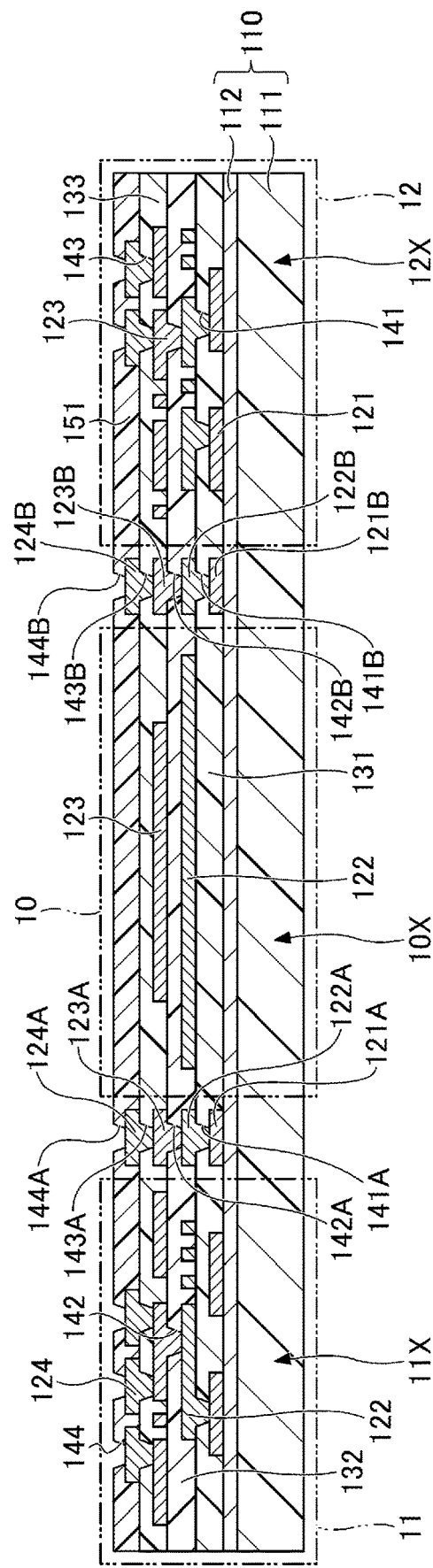

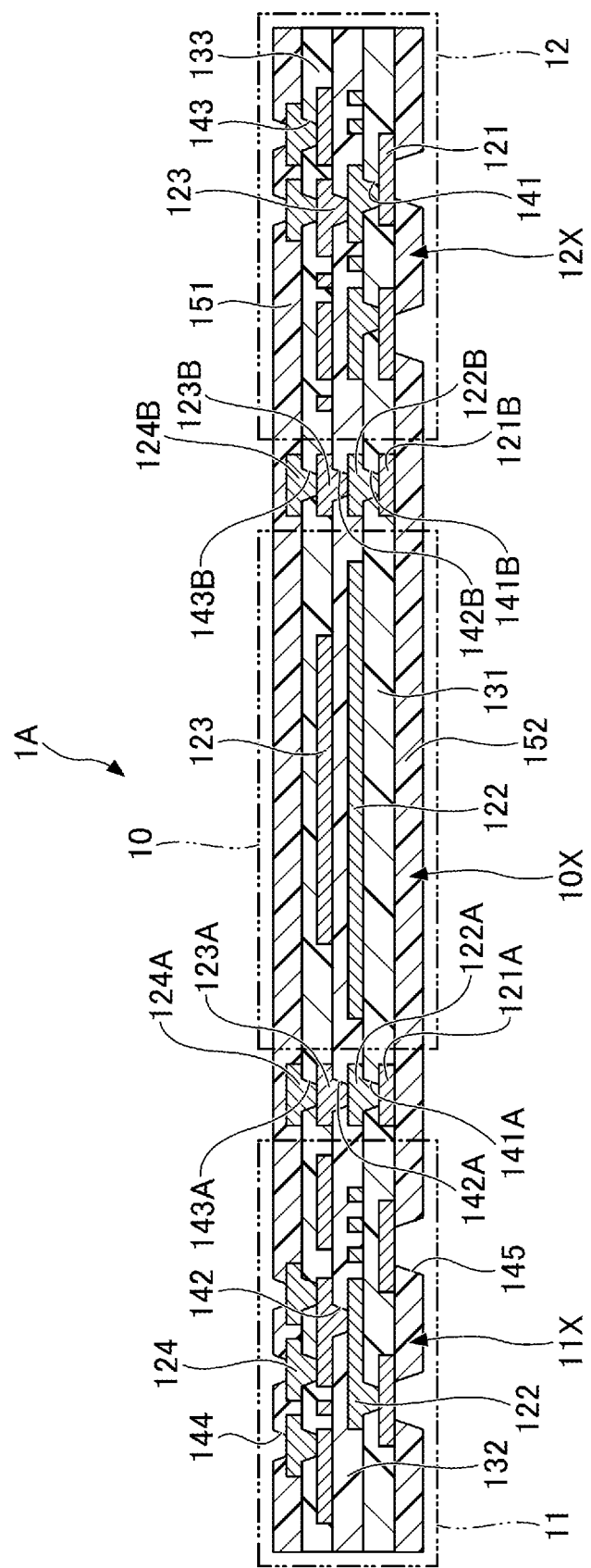

FLEXIBLE SUBSTRATE AND SEMICONDUCTOR APPARATUS

CROSS-REFERENCE TO RELATED APPLICATIONS

The present application is based upon and claims the benefit of priority from the prior Japanese Patent Application No. 2020-180721 filed on Oct. 28, 2020, with the Japanese Patent Office, the entire contents of which are incorporated herein by reference.

FIELD

The disclosures herein relate to flexible substrates and semiconductor apparatuses.

BACKGROUND

A circuit board configuration has been advanced that has two mounting areas for mounting semiconductor devices and a connecting area connecting the two mounting areas and that is bent at the connecting area when used (Patent Document 1).

When bent at the connecting area, the related-art circuit boards may develop cracks near a connecting member such as solder for connecting the circuit board and a semiconductor device, or may develop cracks in circuits inside the mounting areas. The occurrence of such cracks leads to degradation in the reliability of mounting.

It may be an object of the present disclosures to provide a flexible substrate and a semiconductor apparatus for which the reliability of mounting can be improved.

[Patent Document 1] International Publication Pamphlet No. WO2014/103772

SUMMARY

According to an aspect of the embodiment, a flexible substrate includes a first area including a first circuit, the first circuit configured to be connectable to a first component, a second area including a second circuit, the second circuit configured to be connectable to a second component, a connecting area provided between the first area and the second area and including a third circuit, the third circuit connecting the first circuit and the second circuit, one or more first via conductors provided between the first area and the connecting area and electrically isolated from the first circuit, the second circuit, and the third circuit, and one or more second via conductors provided between the second area and the connecting area and electrically isolated from the first circuit, the second circuit, and the third circuit.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 6A and 6B are cross-sectional views illustrating the method of making the flexible substrate according to the embodiment;

FIGS. 7A and 7B are cross-sectional views illustrating the method of making the flexible substrate according to the embodiment;

FIGS. 8A and 8B are cross-sectional views illustrating the method of making the flexible substrate according to the embodiment;

FIGS. 9A and 9B are cross-sectional views illustrating the method of making the flexible substrate according to the embodiment;

FIGS. 10A and 10B are cross-sectional views illustrating the method of making the flexible substrate according to the embodiment;

FIG. 12 is a cross-sectional view of a flexible substrate according to the first variation.

DESCRIPTION OF EMBODIMENTS

The inventors of the present application have diligently studied the mechanism by which cracks occurs in related-art circuit boards. The study has resulted in the finding that although tensile stress and compressive stress generated in an insulating resin layer upon the bending of a connecting area are also applied to the mounting areas, strong stress occurs in the proximity of a connecting member such as solder, because the modulus of elasticity greatly differs between the insulating resin layer and semiconductor devices. Further, it has also been found that stress occurring in the proximity of a connecting member propagates to circuits inside the mounting areas.

The diligent study conducted by the inventors of the present application has revealed that the above-noted mechanism is behind the occurrence of stress in the mounting areas and thus the occurrence of cracks when the connecting area is bent.

In the following, the embodiment will be described with reference to the accompanying drawings. In the specification and drawings, elements having substantially the same functions or configurations are referred to by the same numerals, and a duplicate description thereof may be omitted.

<Structure of Flexible Substrate>

Figure 1:
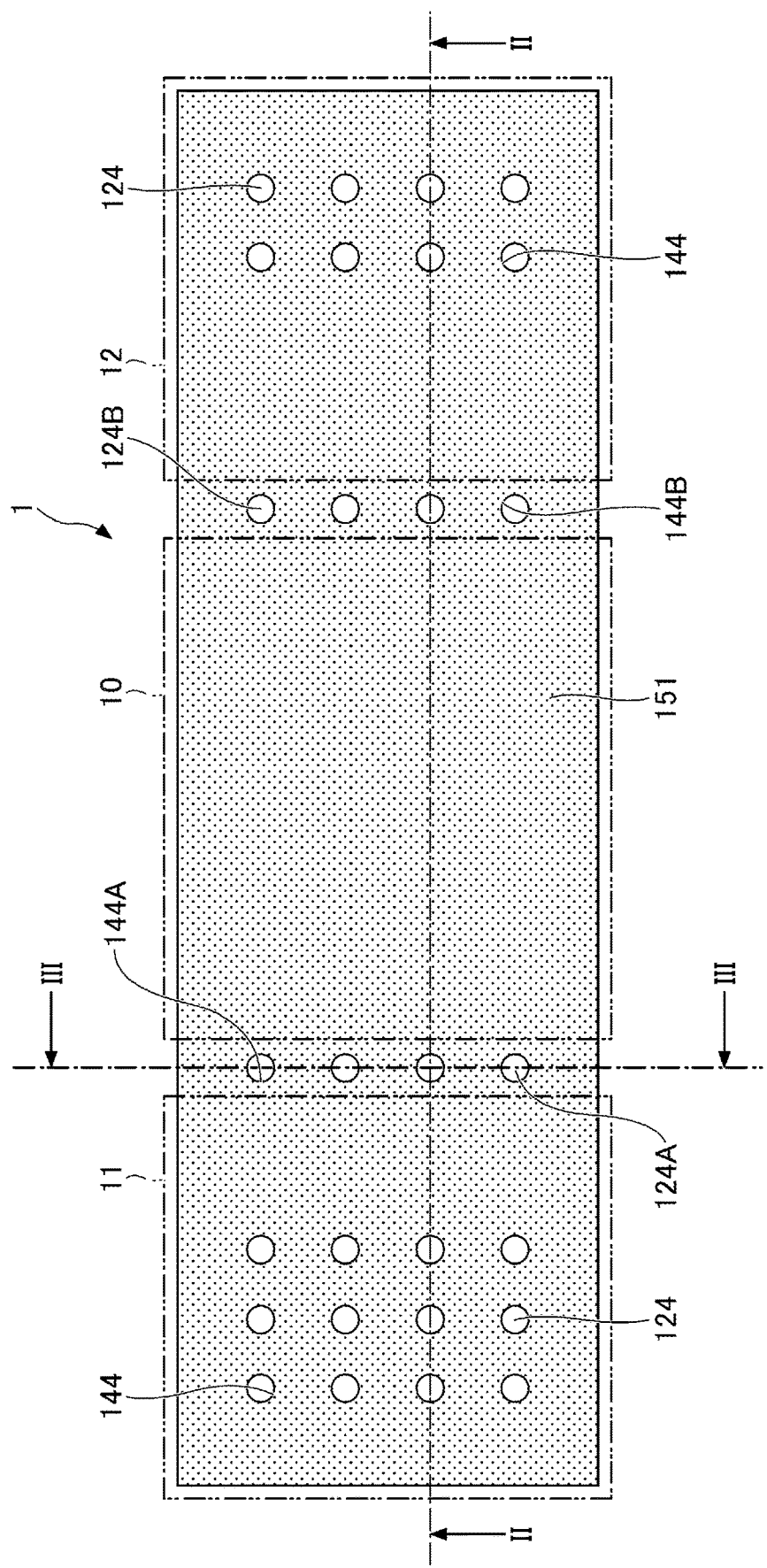
FIG. 1 is a top view of a flexible substrate according to an embodiment.
Figure 2:
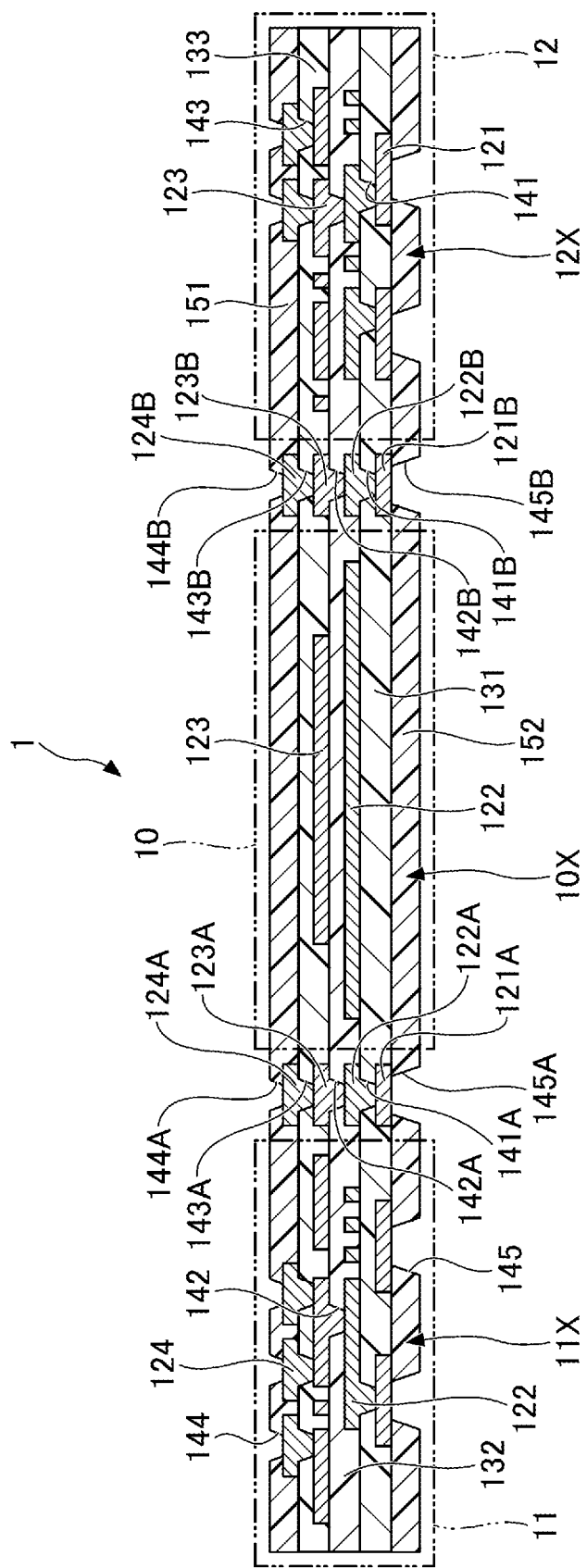
FIG. 2 is a cross-sectional view of the flexible substrate according to the embodiment.
Figure 3:
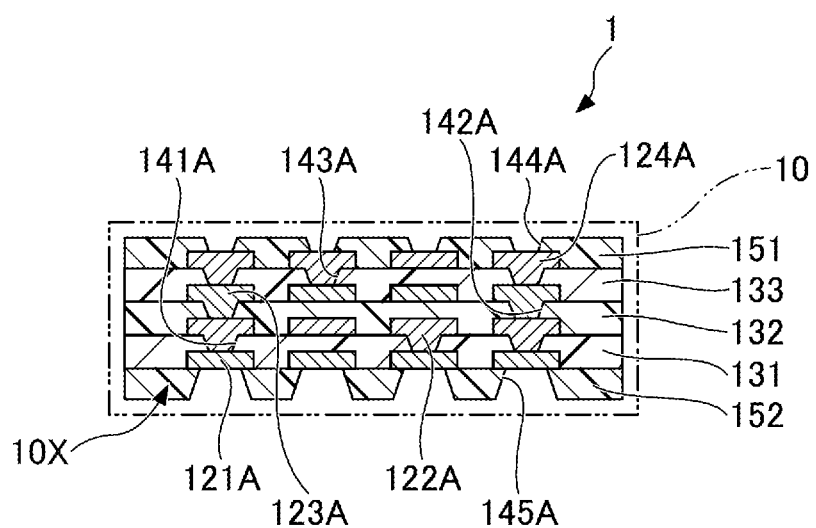
FIG. 3 is a cross-sectional view of the flexible substrate according to the embodiment.

In the following, the structure of a flexible substrate according to an embodiment will be described. FIG. 1 is a top view of a flexible substrate according to the embodiment. FIG. 2 and FIG. 3 are cross-sectional views illustrating the flexible substrate according to the embodiment. FIG. 2 corresponds to a view of a cross-section taken along the line II-II in FIG. 1. FIG. 3 corresponds to a view of a cross-section taken along the line III-III in FIG. 1.

As illustrated in FIG. 1 and FIG. 2, a flexible substrate 1 of the embodiment includes a first area 11, a second area 12, and a connecting area 10. The first area 11 is the area in which a first component such as a semiconductor device (see FIG. 4) is mounted, and includes a first circuit 11X to be connected to the first component. The second area 12 is the area in which a second component such as a semiconductor device (see FIG. 4) is mounted, and includes a second circuit 12X to be connected to the second component. The connecting area 10 is disposed between the first area 11 and the second area 12, and includes a third circuit 10X connecting the first circuit and the second circuit.

As will be described later in detail, a first via conductor is provided between the first area and the connecting area 10, and a second via conductor is provided between the second area 12 and the connecting area 10. The number of first via conductors and second via conductors is not limited to any particular number. A plurality of first via conductors and a plurality of second via conductors may be provided.

As illustrated in FIG. 2 and FIG. 3, a flexible substrate 1 includes a plurality of insulating resin layers stacked one over another, e.g., a first insulating resin layer 131, a second insulating resin layer 132, and a third insulating resin layer 133. The second insulating resin layer 132 is disposed between the first insulating resin layer 131 and the third insulating resin layer 133. In the present disclosures, the side of the first insulating resin layer 131 where the second insulating resin layer 132 is situated may be referred to as an upper side. It may be noted, however, that the flexible substrate 1 may be used in an upside-down orientation, or may be placed at any angle. Further, a plan view of an object refers to a view taken in the direction normal to the surface of the third insulating resin layer 133 opposite from the side thereof where the second insulating resin layer 132 is situated. The second insulating resin layer 132 is disposed on the first insulating resin layer 131, and the third insulating resin layer 133 is disposed on the second insulating resin layer 132. The first insulating resin layer 131, the second insulating resin layer 132, and the third insulating resin layer 133 are resin layers containing an insulating resin such as an epoxy-based resin or a polyimide-based resin, for example. The first insulating resin layer 131, the second insulating resin layer 132, and the third insulating resin layer 133 may include a filler such as silica.

The flexible substrate 1 includes a first interconnect layer 121, a second interconnect layer 122, a third interconnect layer 123, and a fourth interconnect layer 124. The first interconnect layer 121 is situated on the lower surface side of the first insulating resin layer 131. The second interconnect layer 122 is situated between the first insulating resin layer 131 and the second insulating resin layer 132. The third interconnect layer 123 is situated between the second insulating resin layer 132 and the third insulating resin layer 133. The fourth interconnect layer 124 is situated on the upper surface side of the third insulating resin layer 133. The first interconnect layer 121 may be embedded in the first insulating resin layer 131. The first interconnect layer 121, the second interconnect layer 122, the third interconnect layer 123, and the fourth interconnect layer 124 are conductive layers containing copper, for example.

The first insulating resin layer 131 has via holes 141 reaching the contact sections of the first interconnect layer 121. Portions of the second interconnect layer 122 are coupled to the first interconnect layer 121 through the via holes 141. The second insulating resin layer 132 has via holes 142 reaching the contact sections of the second interconnect layer 122. Portions of the third interconnect layer 123 are coupled to the second interconnect layer 122 through the via holes 142. The third insulating resin layer 133 has via holes 143 reaching the contact sections of the third interconnect layer 123. Portions of the fourth interconnect layer 124 are coupled to the third interconnect layer 123 through the via holes 143.

A solder resist layer 151 is formed on the upper surface of the third insulating resin layer 133. A solder resist layer 152 is formed on the lower surfaces of the first interconnect layer 121 and the first insulating resin layer 131. The solder resist layer 151 has openings 144 reaching the contact sections of the fourth interconnect layer 124. The solder resist layer 152 has openings 145 reaching the contact sections of the first interconnect layer 121. The portions of the fourth interconnect layer 124 exposed in the openings 144 and the portions of the first interconnect layer 121 exposed in the openings 145 may be subjected to a surface treatment to have a surface treatment layer formed thereon. The surface treatment layer may be a metal layer, or may be an organic coating made by applying anti-oxidizing treatment such as OSP (i.e., organic solderability preservative) treatment or the like. Examples of the metal layer include an Ni/Au layer (a metal layer made by laminating an Ni layer and an Au layer in this order), an Ni/Pd/Au layer (a metal layer made by laminating an Ni layer, a Pd layer, and an Au layer in this order), a Pd/Au layer (a metal layer made by laminating a Pd layer and an Au layer in this order), an Sn layer, an Au layer, an Ag layer, and the like. In place of the Ni layer, an Ni alloy layer containing P or B may be used. Further, in place of the Pd layer, a Pd alloy layer containing P may be used.

The first interconnect layer 121, the second interconnect layer 122, the third interconnect layer 123, and the fourth interconnect layer 124 constitute the first circuit 11X in the first area 11. The first interconnect layer 121, the second interconnect layer 122, the third interconnect layer 123, and the fourth interconnect layer 124 constitute the second circuit 12X in the second area 12. The first interconnect layer 121, the second interconnect layer 122, the third interconnect layer 123, and the fourth interconnect layer 124 constitute the third circuit 10X in the connecting area 10. The third circuit 10X is electrically connected to the first circuit 11X and the second circuit 12X. The first circuit 11X and the second circuit 12X are electrically connected to each other via the third circuit 10X.

The connecting area 10 may not have any of the via holes 141, 142, and 143. The first interconnect layer 121, the second interconnect layer 122, the third interconnect layer 123, and the fourth interconnect layer 124 may not be connected to each other in the connecting area 10. Neither the first interconnect layer 121 nor the fourth interconnect layer 124 may be provided in the connecting area 10.

A region between the first area 11 and the connecting area 10 has a first interconnect layer 121A which is part of the first interconnect layer 121, a second interconnect layer 122A which is part of the second interconnect layer 122, a third interconnect layer 123A which is part of the third interconnect layer 123, and a fourth interconnect layer 124A which is part of the fourth interconnect layer 124. It may be noted, however, that the first interconnect layer 121A, the second interconnect layer 122A, the third interconnect layer 123A, and the fourth interconnect layer 124A are electrically isolated from the first circuit 11X, the second circuit 12X, and the third circuit 10X.

The region between the first area 11 and the connecting area 10 has a via hole 141A formed in the first insulating resin layer 131, a via hole 142A formed in the second insulating resin layer 132, and a via hole 143A formed in the third insulating resin layer 133. A portion of the second interconnect layer 122A is connected to the first interconnect layer 121A through the via hole 141A. A portion of the third interconnect layer 123A is connected to the second interconnect layer 122A through the via hole 142A. A portion of the fourth interconnect layer 124A is connected to the third interconnect layer 123A through the via hole 143A. The portion of the second interconnect layer 122A inside the via hole 141A, the portion of the third interconnect layer 123A inside the via hole 142A, and the portion of the fourth interconnect layer 124A inside the via hole 143A are examples of first via conductors.

In a plan view, the via hole 141A, the via hole 142A, and the via hole 143A may overlap each other, and a stacked via structure may be constituted by the first interconnect layer 121A, the second interconnect layer 122A, the third interconnect layer 123A, and the fourth interconnect layer 124A between the first area 11 and the connecting area 10.

A region between the second area 12 and the connecting area 10 has a first interconnect layer 121B which is part of the first interconnect layer 121, a second interconnect layer 122B which is part of the second interconnect layer 122, a third interconnect layer 123B which is part of the third interconnect layer 123, and a fourth interconnect layer 124B which is part of the fourth interconnect layer 124. It may be noted, however, that the first interconnect layer 121B, the second interconnect layer 122B, the third interconnect layer 123B, and the fourth interconnect layer 124B are electrically isolated from the first circuit 11X, the second circuit 12X, and the third circuit 10X.

The region between the second area 12 and the connecting area 10 has a via hole 141B formed in the first insulating resin layer 131, a via hole 142B formed in the second insulating resin layer 132, and a via hole 143B formed in the third insulating resin layer 133. A portion of the second interconnect layer 122B is connected to the first interconnect layer 121B through the via hole 141B. A portion of the third interconnect layer 123B is connected to the second interconnect layer 122B through the via hole 142B. A portion of the fourth interconnect layer 124B is connected to the third interconnect layer 123B through the via hole 143B. The portion of the second interconnect layer 122B inside the via hole 141B, the portion of the third interconnect layer 123B inside the via hole 142B, and the portion of the fourth interconnect layer 124B inside the via hole 143B are examples of second via conductors.

In a plan view, the via hole 141B, the via hole 142B, and the via hole 143B may overlap each other, and a stacked via structure may be constituted by the first interconnect layer 121B, the second interconnect layer 122B, the third interconnect layer 123B, and the fourth interconnect layer 124B between the second area 12 and the connecting area 10.

The region between the first area 11 and the connecting area 10 has an opening 144A formed in the solder resist layer 151 to reach the contact section of the fourth interconnect layer 124A, and has an opening 145A in the solder resist layer 152 to reach the contact section of the first interconnect layer 121A.

[Function and Effect of Flexible Substrate]

Figure 4:
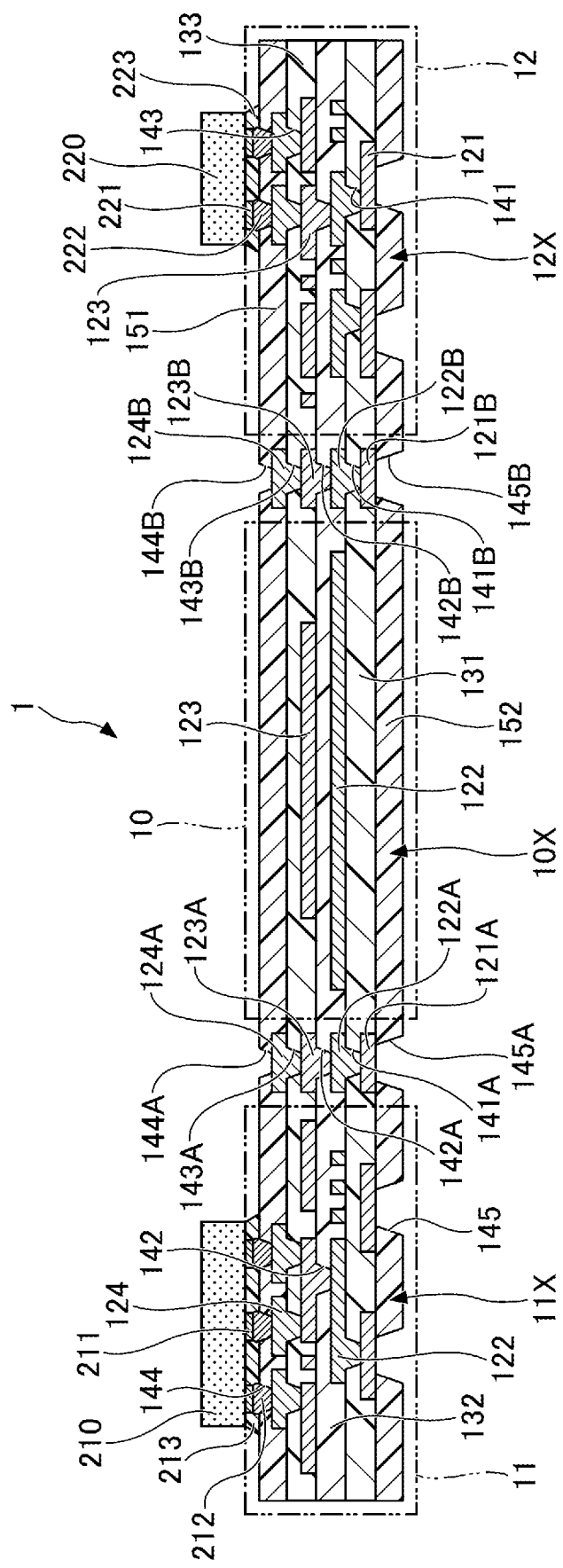
FIG. 4 is a cross-sectional view illustrating an example of usage of the flexible substrate according to the embodiment.
Figure 5:
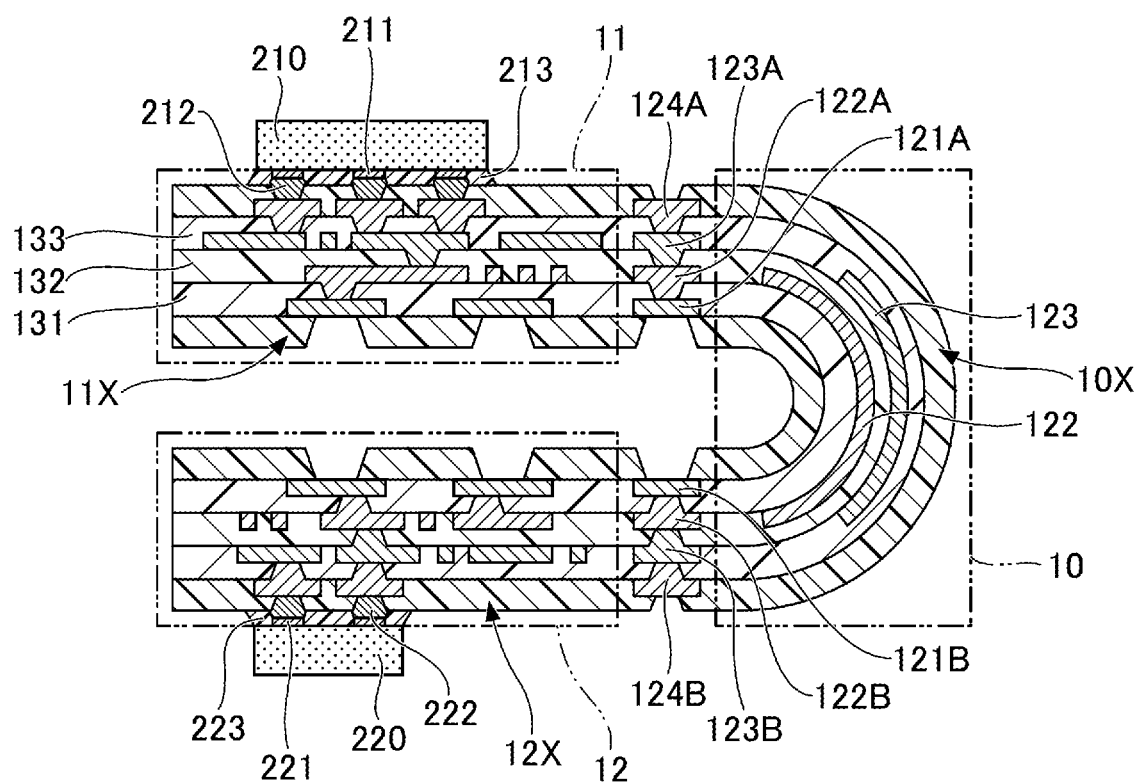
FIG. 5 is a cross-sectional view illustrating an example of usage of the flexible substrate according to the embodiment.

In the following, the function and effect of the flexible substrate 1 will be described. The flexible substrate 1 is used, with a first component mounted in the first area 11 and a second component mounted in the second area 12. FIG. 4 and FIG. 5 are cross-sectional views illustrating an example of usage of the flexible substrate 1 according to the embodiment. The structure illustrated in FIG. 4 and FIG. 5 is an example of a semiconductor apparatus.

As illustrated in FIG. 4, a semiconductor device 210, such as an integrated circuit (IC) chip, is mounted to the first area 11. The semiconductor device 210 has a plurality of external connection terminals 211. The external connection terminals 211 and the portions of the fourth interconnect layer 124 exposed in the openings 144 are connected by using connecting members 212 such as solder. An underfill 213 may be provided between the semiconductor device 210 and the solder resist layer 151. The semiconductor device 210 is an example of the first component.

As illustrated in FIG. 4, a semiconductor device 220 such as an IC chip is mounted to the second area 12. The semiconductor device 220 has a plurality of external connection terminals 221. The external connection terminals 221 and the portions of the fourth interconnect layer 124 exposed in the openings 144 are connected by using connecting members 222 such as solder. An underfill 223 may be provided between the semiconductor device 220 and the solder resist layer 151. The semiconductor device 220 is an example of the second component.

As illustrated in FIG. 5, the flexible substrate 1 may be used by bending the connecting area 10 after the first component is mounted in the first area 11 and the second component is mounted in the second area 12.

FIG. 5 illustrates how the flexible substrate 1 is bent, with the solder resist layer 151 situated on the outside, and the solder resist layer 152 situated on the inside. In this case, stresses are applied in the connecting area 10 in the direction generally parallel to the main surface of the flexible substrate 1, i.e., stress in the compression direction applied to the first insulating resin layer 131, stress in the tension direction applied to the third insulating resin layer 133, and stress applied to the second insulating resin layer 132 in balance with these stresses, so that the first insulating resin layer 131, the second insulating resin layer 132, and the third insulating resin layer 133 are extended or contracted in the connecting area 10.

In this embodiment, the region between the connecting area 10 and the first area 11 has provided therein the first interconnect layer 121A, the second interconnect layer 122A, the third interconnect layer 123A, and the fourth interconnect layer 124A, and the elastic modulus of the first interconnect layer 121A, the second interconnect layer 122A, the third interconnect layer 123A, and the fourth interconnect layer 124A is greater than the elastic modulus of the first insulating resin layer 131, the second insulating resin layer 132, and the third insulating resin layer 133. Namely, the first interconnect layer 121A, the second interconnect layer 122A, the third interconnect layer 123A, and the fourth interconnect layer 124A are less deformable than the first insulating resin layer 131, the second insulating resin layer 132, and the third insulating resin layer 133. As a result, the first interconnect layer 121A, the second interconnect layer 122A, the third interconnect layer 123A, and the fourth interconnect layer 124A reduce strain in the first area 11, even when the first insulating resin layer 131, the second insulating resin layer 132, and the third insulating resin layer 133 are extended or contracted.

Similarly, the region between the connecting area 10 and the second area 12 has provided therein the first interconnect layer 121B, the second interconnect layer 122B, the third interconnect layer 123B, and the fourth interconnect layer 124B, and the elastic modulus of the first interconnect layer 121B, the second interconnect layer 122B, the third interconnect layer 123B, and the fourth interconnect layer 124B is greater than the elastic modulus of the first insulating resin layer 131, the second insulating resin layer 132, and the third insulating resin layer 133. Namely, the first interconnect layer 121B, the second interconnect layer 122B, the third interconnect layer 123B, and the fourth interconnect layer 124B are less deformable than the first insulating resin layer 131, the second insulating resin layer 132, and the third insulating resin layer 133. As a result, the first interconnect layer 121B, the second interconnect layer 122B, the third interconnect layer 123B, and the fourth interconnect layer 124B reduce strain in the second area 12, even when the first insulating resin layer 131, the second insulating resin layer 132, and the third insulating resin layer 133 are extended or contracted.

Thus even when the connecting area 10 is bent, the likelihood of cracking is reduced in the proximity of the connecting members 212 and in the proximity of the connecting members 222, so that the likelihood of cracking is reduced in the first circuit 11X and the second circuit 12X.

Further, the openings 144A and 144B are formed in the solder resist layer 151 and the openings 145A and 145B are formed in the solder resist layer 152, so that the effects of extension and contraction occurring in the solder resist layers 151 and 152 in the connecting area 10 do not readily propagate to the first area 11 and the second area 12.

Moreover, even if cracking occurs in any of the first interconnect layer 121A, the second interconnect layer 122A, the third interconnect layer 123A, and the fourth interconnect layer 124A contained in the first via conductors, the electrical characteristics of the semiconductor devices illustrated in FIG. 5 are not readily affected because the first via conductors are electrically isolated from the first circuit 11X, the second circuit 12X, and the third circuit 10X. Similarly, even if cracking occurs in any of the first interconnect layer 121B, the second interconnect layer 122B, the third interconnect layer 123B, and the fourth interconnect layer 124B contained in the second via conductors, the electrical characteristics of the semiconductor devices illustrated in FIG. 5 are not readily affected because the second via conductors are electrically isolated from the first circuit 11X, the second circuit 12X, and the third circuit 10X.

The semiconductor devices 210 and 220 are not limited to IC chips, and memory chips or capacitors or the like may be used. In addition, the first and second components are not limited to electronic components such as semiconductor devices, and a connector or the like may be used as the first or second component.

[Method of Making Flexible Substrate]

In the following, the method of making the flexible substrate 1 will be described. FIGS. 6A and 6B through FIGS. 11A and 11B are cross-sectional views illustrating the method of making the flexible substrate according to the embodiment.

As illustrated in FIG. 6A, a support base 110 is provided. The support base 110 may be, for example, a copper-clad laminate including a base 111 and a copper foil 112 formed on a major surface of the base 111. An adhesive layer may be disposed between the base 111 and the copper foil 112. The base 111 may be a woven cloth or unwoven cloth (not shown) of glass fiber, aramid fiber, or the like impregnated with an insulating resin such as an epoxy-based resin, for example.

Subsequently, as illustrated in FIG. 6B, the first interconnect layer 121 is formed on the copper foil 112. The first interconnect layer 121 includes the first interconnect layer 121A which is positioned between the first area 11 and the connecting area 10 and separate from the rest, and further includes the first interconnect layer 121B which is positioned between the second area 12 and the connecting area 10 and separate from the rest. The first interconnect layer 121 may be formed by a semi-additive process (SAP), for example. A resist layer having openings at desired locations is formed on the surface of the copper foil 112, for example. The openings are formed to expose the copper foil 112 at the positions corresponding to the positions of the first interconnect layer 121. As the material of the resist layer, a photosensitive dry film resist or a liquid photoresist (e.g., a dry film resist or a liquid resist of a novolac-based resin, an acrylic-based resin, or the like) may be used. With the resist layer used as a plating mask, electrolytic plating (electrolytic copper plating) is performed on the surface of the copper foil 112 by utilizing the copper foil 112 as a power feeding layer, thereby forming the first interconnect layer 121. The resist layer is then removed by an alkaline stripping solution, for example.

As illustrated in FIG. 7A, an uncured resin film is attached to the copper foil 112 so as to cover the first interconnect layer 121, and is heated and cured to form the first insulating resin layer 131. The first insulating resin layer 131 is made of an insulating resin such as an epoxy resin or a polyimide resin. Alternatively, a liquid resin may be applied to form the first insulating resin layer 131.

Subsequently, as illustrated in FIG. 7B, the first insulating resin layer 131 is processed by a laser beam, which forms, through the first insulating resin layer 131, via holes 141 that reach the contact sections of the first interconnect layer 121. After the formation of the via holes 141, a desmear process may be performed according to need. The via holes 141 are formed such that the via hole 141A reaching the contact section of the first interconnect layer 121A and the via hole 141B reaching the contact section of the first interconnect layer 121B are included.

As illustrated in FIG. 8A, the second interconnect layer 122 is formed on the first insulating resin layer 131, and is connected to the first interconnect layer 121 through the via conductors inside the via holes 141. The second interconnect layer 122 is formed such that the second interconnect layer 122A connected to the first interconnect layer 121A through the via conductor in the via hole 141A and the second interconnect layer 122B connected to the first interconnect layer 121B through the via conductor in the via hole 141B are included. The second interconnect layer 122A and the second interconnect layer 122B as formed are electrically isolated from the rest of the second interconnect layer 122. The second interconnect layer 122 may be formed by a semi-additive process, for example. A seed layer is first formed on the surface of the first insulating resin layer 131 by electroless plating, for example. A resist layer having openings at predetermined locations is formed on the seed layer. As the material of the resist layer, a photosensitive dry film resist or a liquid photoresist (e.g., a dry film resist or a liquid resist of a novolac-based resin, an acrylic-based resin, or the like) may be used. With the resist layer used as a plating mask, electrolytic plating (electrolytic copper plating) is performed by utilizing the seed layer as a power feeding layer, thereby forming an electroplating layer. The resist layer is then removed by an alkaline stripping solution or the like, followed by using the electroplating layer as an etching mask to remove unnecessary portions of the seed layer. This results in the formation of the second interconnect layer 122. The second interconnect layer 122 may alternatively be formed by a subtractive process.

Subsequently, as illustrated in FIG. 8B, the second insulating resin layer 132 is formed on the first insulating resin layer 131 such as to cover the second interconnect layer 122.

The second insulating resin layer 132 may be formed similarly to the manner in which the first insulating resin layer 131 is formed.

Subsequently, as illustrated in FIG. 9A, the via holes 142 that reach the contact sections of the second interconnect layer 122 are formed through the second insulating resin layer 132. The via holes 142 are formed such that the via hole 142A reaching the contact section of the second interconnect layer 122A and the via hole 142B reaching the contact section of the second interconnect layer 122B are included. The via holes 142 may be formed similarly to the manner in which the via holes 141 are formed. After the formation of the via holes 142, a desmear process may be performed according to need. Further, the third interconnect layer 123 is formed on the second insulating resin layer 132, and is connected to the second interconnect layer 122 through the via conductors inside the via holes 142. The third interconnect layer 123 is formed such that the third interconnect layer 123A connected to the second interconnect layer 122A through the via conductor in the via hole 142A and the third interconnect layer 123B connected to the second interconnect layer 122B through the via conductor in the via hole 142B are included. The third interconnect layer 123A and the third interconnect layer 123B as formed are electrically isolated from the rest of the third interconnect layer 123. The third interconnect layer 123 may be formed similarly to the manner in which the second interconnect layer 122 is formed.

Subsequently, as illustrated in FIG. 9B, the third insulating resin layer 133 is formed on the second insulating resin layer 132 such as to cover the third interconnect layer 123. The third insulating resin layer 133 may be formed similarly to the manner in which the first insulating resin layer 131 is formed.

Subsequently, as illustrated in FIG. 10A, the via holes 143 that reach the contact sections of the third interconnect layer 123 are formed through the third insulating resin layer 133. The via holes 143 are formed such that the via hole 143A reaching the contact section of the third interconnect layer 123A and the via hole 143B reaching the contact section of the third interconnect layer 123B are included. The via holes 143 may be formed similarly to the manner in which the via holes 141 are formed. After the formation of the via holes 143, a desmear process may be performed according to need. Further, the fourth interconnect layer 124 is formed on the third insulating resin layer 133, and is connected to the third interconnect layer 123 through the via conductors inside the via holes 143. The fourth interconnect layer 124 is formed such that the fourth interconnect layer 124A connected to the third interconnect layer 123A through the via conductor in the via hole 143A and the fourth interconnect layer 124B connected to the third interconnect layer 123B through the via conductor in the via hole 143B are included. The fourth interconnect layer 124A and the fourth interconnect layer 124B as formed are electrically isolated from the rest of the fourth interconnect layer 124. The fourth interconnect layer 124 may be formed similarly to the manner in which the second interconnect layer 122 is formed.

Subsequently, as illustrated in FIG. 10B, the solder resist layer 151 is formed on the third insulating resin layer 133. Thereafter, the openings 144 that reach the contact sections of the fourth interconnect layer 124 are formed through the solder resist layer 151. The openings 144 are formed such that the opening 144A reaching the contact section of the fourth interconnect layer 124A and the opening 144B reaching the contact section of the fourth interconnect layer 124B are included.

The solder resist layer 151 is made of an insulating resin such as a photosensitive epoxy resin or acrylic resin. The solder resist layer 151 may be formed by attaching resin films or applying a liquid resin. The openings 144 may be formed by exposure to light and development. An insulating resin such as a non-photosensitive epoxy resin or polyimide resin may be used as the solder resist layer 151. In this case, the openings 144 may be formed by a laser process or by blasting.

Figure 11A:
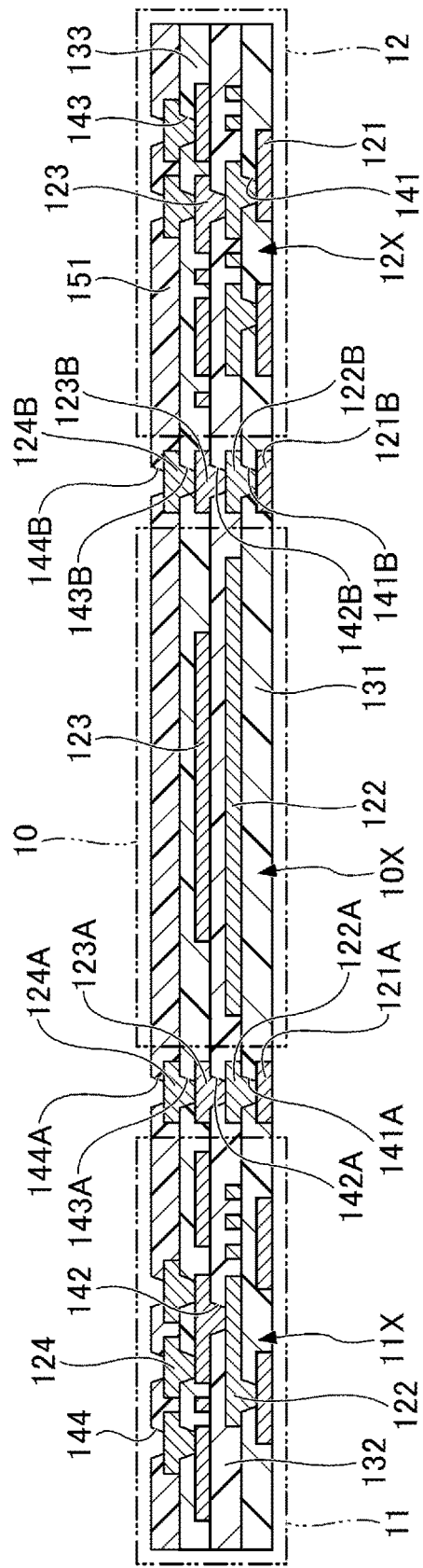
FIGS. 11A and 11B are cross-sectional views illustrating the method of making the flexible substrate according to the embodiment.

Subsequently, as illustrated in FIG. 11A, the support base 110 is detached from the first interconnect layer 121 and the first insulating resin layer 131.

Figure 11B:
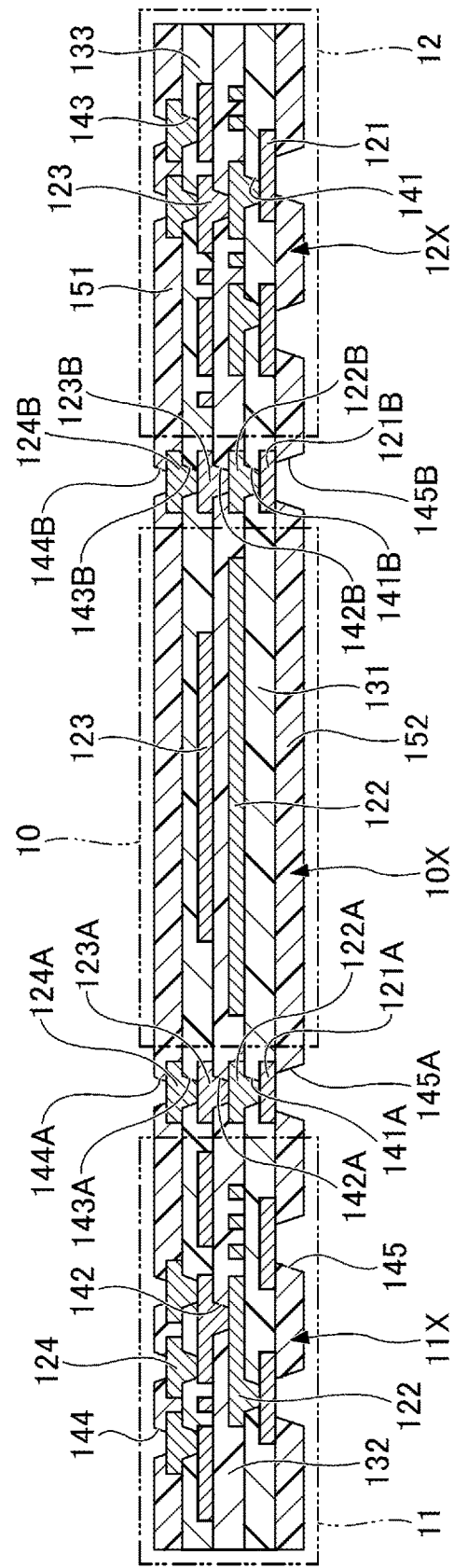

Subsequently, as illustrated in FIG. 11B, the solder resist layer 152 is formed on the exposed surface of the first interconnect layer 121 and the first insulating resin layer 131. Thereafter, the openings 145 that reach the contact sections of the first interconnect layer 121 are formed through the solder resist layer 152. The openings 145 are formed such that the opening 145A reaching the contact section of the first interconnect layer 121A and the opening 145B reaching the contact section of the first interconnect layer 121B are included. The solder resist layer 152 may be formed similarly to the manner in which the solder resist layer 151 is formed, and the openings 145 may be formed similarly to the manner in which the openings 144 are formed.

In this manner, the flexible substrate 1 of the embodiment is completed in final form.

Instead of forming the solder resist layer 152 after detaching the support base 110, the solder resist layer 152 may be formed on the support base 110 before the first interconnect layer 121A is formed, followed by forming the first interconnect layer 121A and the like on the solder resist layer 152.

[First Variation]

In the following, a first variation will be described. FIG. 12 is a cross-sectional view of a flexible substrate according to the first variation.

As illustrated in FIG. 12, a flexible substrate 1A according to the first variation is such that the openings 144A and 144B are not formed in the solder resist layer 151, and the openings 145A and 145B are not formed in the solder resist layer 152.

The remaining configurations are substantially the same as the configurations of the embodiment.

Even when the connecting area 10 is bent in the first variation, the likelihood of cracking is reduced in the proximity of the connecting members 212 and in the proximity of the connecting members 222, so that the likelihood of cracking is reduced in the first circuit 11X and the second circuit 12X.

The first variation may be used when the solder resist layers 151 and 152 are more deformable than the first insulating resin layer 131, the second insulating resin layer 132, and the third insulating resin layer 133, for example.

[Second Variation]

Figure 13:
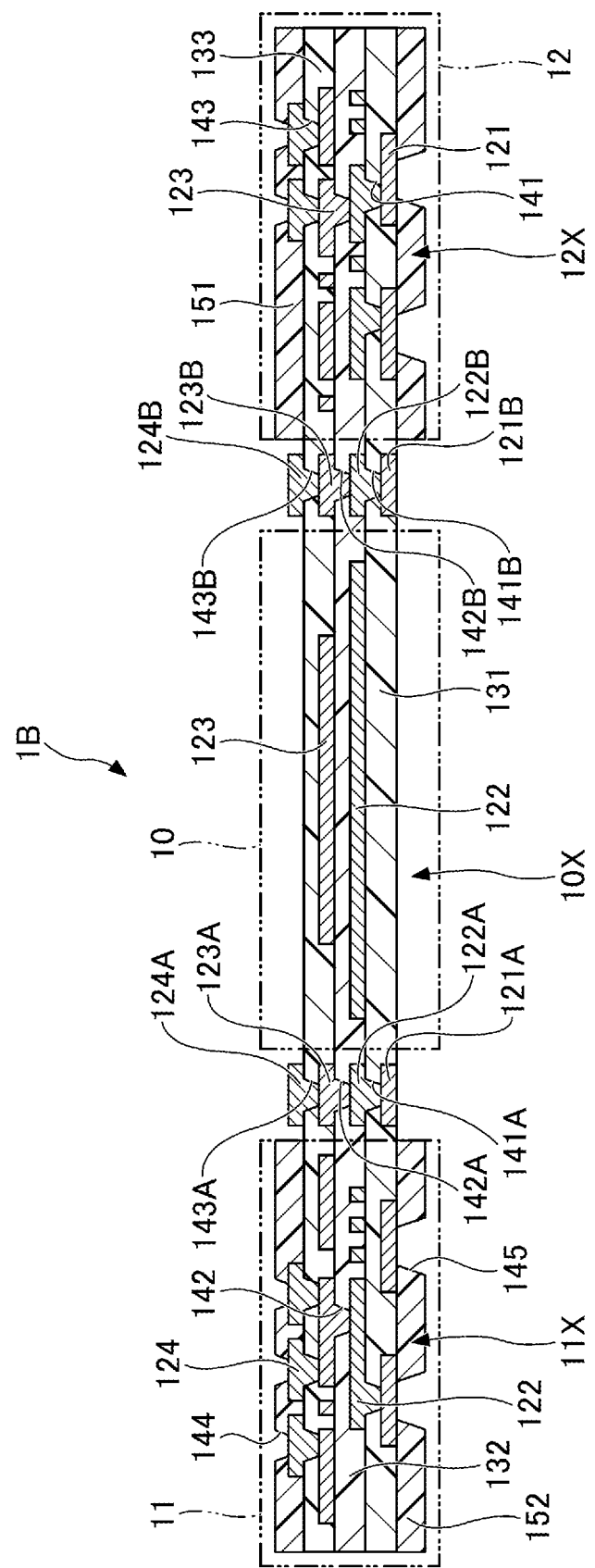
FIG. 13 is a cross-sectional view of a flexible substrate according to a second variation.

In the following, a second variation will be described. FIG. 13 is a cross-sectional view of a flexible substrate according to a second variation.

As illustrated in FIG. 13, a flexible substrate 1B according to the second variation is such that the solder resist layers 151 and 152 are provided in the first area 11 and the second area 12, but are not provided in the connecting area 10. It may further be the case that the solder resist layers 151 and 152 are not provided in the area in which the first via conductors are provided between the first area 11 and the connecting area 10 and in the area in which the second via conductors are provided between the second area 12 and the connecting area 10.

The remaining configurations are substantially the same as the configurations of the embodiments.

Even when the connecting area 10 is bent in the second variation, the likelihood of cracking is reduced in the proximity of the connecting members 212 and in the proximity of the connecting members 222, so that the likelihood of cracking is reduced in the first circuit 11X and the second circuit 12X.

If bending the connecting area 10 caused the solder resist layers 151 and 152 to extend and contract, an effect thereof would propagate to the first area 11 and the second area 12. By not providing the solder resist layers 151 and 152 in the connecting area 10, a detrimental effect of the deformation of the solder resist layers can be prevented from occurring.

It may alternatively be the case that the solder resist layer 151 is not formed in the connecting area 10, in the area in which the first via conductors are provided between the first area 11 and the connecting area 10, and in the area in which the second via conductors are provided between the second area 12 and the connecting area 10, while the solder resist layer 152 is formed substantially in the same manner as in the embodiment. Conversely, it may be the case that the solder resist layer 152 is not formed in the connecting area 10, in the area in which the first via conductors are provided between the first area 11 and the connecting area 10, and in the area in which the second via conductors are provided between the second area 12 and the connecting area 10, while the solder resist layer 151 is formed substantially in the same manner as in the embodiment. Namely, the configuration may be such that one of the solder resist layers 151 and 152 is not formed in the connecting area 10, in the area in which the first via conductors are provided between the first area 11 and the connecting area 10, and in the area in which the second via conductors are provided between the second area 12 and the connecting area 10, while the other one of the solder resist layers 151 and 152 is not formed.

In the case in which the connecting area 10 is bent such that the first insulating resin layer 131 is on the outside and the third insulating resin layer 133 is on the inside, only the solder resist layer 151 may be provided in the connecting area 10 when the solder resist layers 151 and 152 are more deformable than the first insulating resin layer 131, the second insulating resin layer 132, and the third insulating resin layer 133, for example. Conversely, only the solder resist layer 152 may be provided in the connecting area 10 when the solder resist layers 151 and 152 are less deformable than the first insulating resin layer 131, the second insulating resin layer 132, and the third insulating resin layer 133.

[Third Variation]

Figure 14:
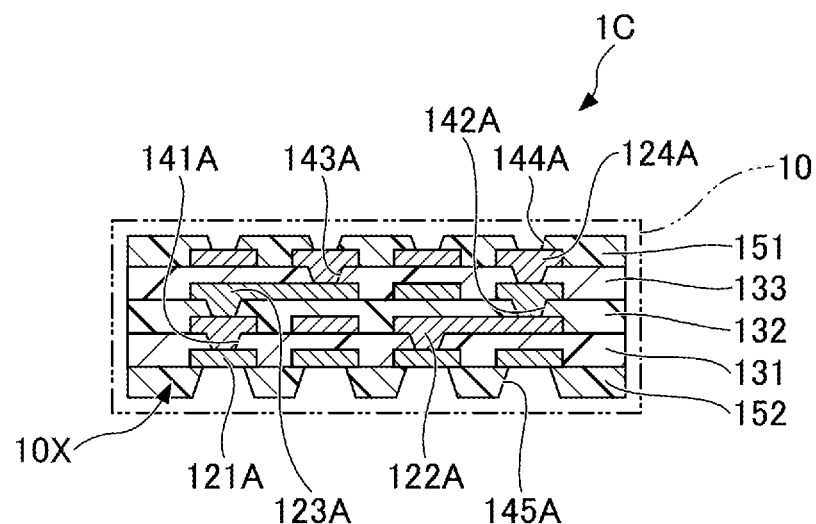
FIG. 14 is a cross-sectional view of a flexible substrate according to a third variation.

In the following, a third variation will be described. FIG. 14 is a cross-sectional view of a flexible substrate according to a third variation.

In the flexible substrate 1 according to the embodiment, as illustrated in FIG. 2, the via conductors of the second interconnect layer 122A, the third interconnect layer 123A, and the fourth interconnect layer 124A overlap the first interconnect layer 121A in the plan view. Namely, a stacked via structure is formed. In contrast, a flexible substrate 1C according to the third variation is such that some of the via conductors are situated at positions deviated from the first interconnect layer 121A in the plan view, as illustrated in FIG. 14. Namely, a stacked via structure is not formed in the third variation.

The remaining configurations are substantially the same as the configurations of the embodiment.

Even when the connecting area 10 is bent in the third variation, the likelihood of cracking is reduced in the proximity of the connecting members 212, so that the likelihood of cracking is reduced in the first circuit 11X.

It may be noted that even when a stacked via structure is not formed with respect to the second via conductors, the likelihood of cracking is reduced in the second circuit 12X.

[Fourth Variation]

Figure 15:
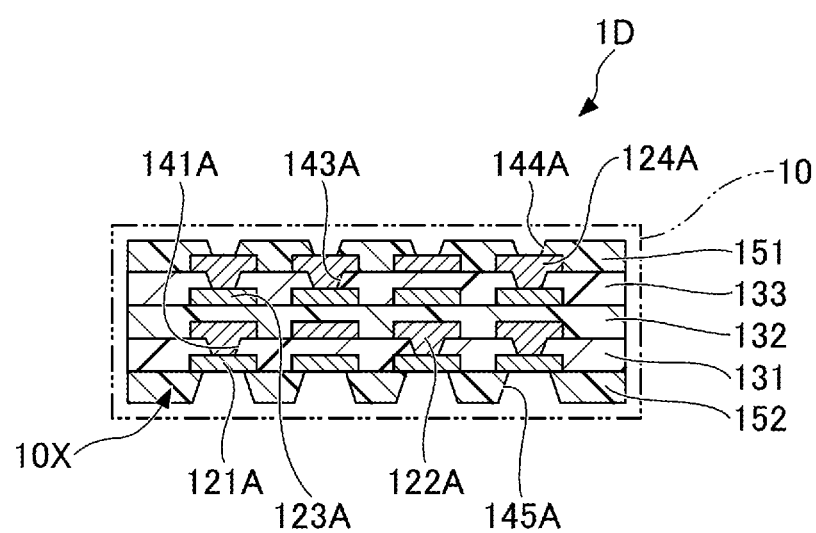
FIG. 15 is a cross-sectional view of a flexible substrate according to a fourth variation.

In the following, a fourth variation will be described. FIG. 15 is a cross-sectional view of a flexible substrate according to a fourth variation.

In the flexible substrate 1 according to the embodiment, as illustrated in FIG. 2, the second interconnect layer 122A is connected to the first interconnect layer 121A, and the third interconnect layer 123A is connected to the second interconnect layer 122A, with the fourth interconnect layer 124A being connected to the third interconnect layer 123A. In contrast, a flexible substrate 1D according to the fourth variation is such that the via hole 142A is not formed in the second insulating resin layer 132, so that the third interconnect layer 123A is not connected to the second interconnect layer 122A, as illustrated in FIG. 15.

The remaining configurations are substantially the same as the configurations of the embodiment.

Among the first insulating resin layer 131, the second insulating resin layer 132, and the third insulating resin layer 133, the layers that will be deformed the most upon bending the connecting area 10 are the first insulating resin layer 131 and the third insulating resin layer 133 that are positioned outside. Providing via conductors for the second interconnect layer 122A and the fourth interconnect layer 124A thereby reduces strain in the first area 11 even when no via conductors are provided for the third interconnect layer 123A. Thus, even when the connecting area 10 is bent in the fourth variation, thus, the likelihood of cracking in the proximity of the connecting members 212 is reduced, so that the likelihood of cracking is reduced in the first circuit 11X.

Further, via conductors are not necessarily provided for both the first insulating resin layer 131 and the third insulating resin layer 133, which are the insulating layers situated at the outermost layer positions. It suffices for one of these two to be provided with via conductors. In such a case, via conductors are preferably provided in the insulating layer that is situated at the outermost position on the outside upon bending the connecting area 10.

It may be noted, with respect to the second via conductors also, that even when no via conductors are provided for the third interconnect layer 123B, the likelihood of cracking in the second circuit 12X is reduced.

According to at least one embodiment, the reliability of mounting can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A flexible substrate comprising: a first area including a first circuit, the first circuit configured to be connectable to a first component; a second area including a second circuit, the second circuit configured to be connectable to a second component; a connecting area provided between the first area and the second area and including a third circuit, the third circuit connecting the first circuit and the second circuit; one or more first via conductors provided between the first area and the connecting area and electrically isolated from the first circuit, the second circuit, and the third circuit; and one or more second via conductors provided between the second area and the connecting area and electrically isolated from the first circuit, the second circuit, and the third circuit, wherein the one or more first via conductors are electrically isolated from the one or more second via conductors; wherein the one or more first via conductors are electrically isolated from any circuits situated in the first area, the second area, or the connecting area, and the one or more second via conductors are electrically isolated from any circuits situated in the first area, the second area, or the connecting area.

2. The flexible substrate as claimed in claim 1, wherein the connecting area is configured to be bendable for time of use of the flexible substrate.

3. The flexible substrate as claimed in claim 1, further comprising a plurality of insulating layers containing therein the first circuit, the second circuit, the third circuit, the one or more first via conductors, and the one or more second via conductors, wherein the one or more first via conductors and the one or more second via conductors are provided in at least one of two outermost insulating layers among the plurality of insulating layers.

4. The flexible substrate as claimed in claim 3, wherein the one or more first via conductors and the one or more second via conductors are provided in an outermost insulating layer, among the plurality of insulating layers, that comes on an outside when bending the connecting area.

5. The flexible substrate as claimed in claim 3, wherein the one or more first via conductors are provided in all of the plurality of insulating layers, and are connected to each other in a thickness direction of the insulating layers.

6. The flexible substrate as claimed in claim 5, wherein the one or more second via conductors are provided in all of the plurality of insulating layers, and are connected to each other in a thickness direction of the insulating layers.

7. The flexible substrate as claimed in claim 1, further comprising a solder resist layer covering the first area and the second area,
wherein the connecting area is not covered with the solder resist layer.

8. The flexible substrate as claimed in claim 1, wherein a via conductor connected to the third circuit is not provided in the connecting area.

9. A semiconductor apparatus, comprising:
the flexible substrate of claim 1;
a first component mounted on the first area and connected to the first circuit; and
a second component mounted on the second area and connected to the second circuit.

* * * * *